United States Patent
Chen et al.

(10) Patent No.: US 11,366,375 B2
(45) Date of Patent: Jun. 21, 2022

(54) PROJECTION APPARATUS

(71) Applicant: Coretronic Corporation, Hsin-Chu (TW)

(72) Inventors: Chia-Tien Chen, Hsin-Chu (TW); Shih-Kan Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/184,548

(22) Filed: Feb. 24, 2021

(65) Prior Publication Data

US 2021/0271157 A1    Sep. 2, 2021

(30) Foreign Application Priority Data

Feb. 27, 2020    (CN) .......................... 202010122427.4

(51) Int. Cl.
| | | |
|---|---|---|
| *G03B 21/14* | (2006.01) | |
| *G03B 21/62* | (2014.01) | |
| *G03B 21/10* | (2006.01) | |
| *G09B 5/02* | (2006.01) | |
| *G03B 21/28* | (2006.01) | |
| *H05K 7/20* | (2006.01) | |
| *G03B 21/16* | (2006.01) | |

(52) U.S. Cl.
CPC .......... *G03B 21/145* (2013.01); *G03B 21/10* (2013.01); *G03B 21/16* (2013.01); *G03B 21/28* (2013.01); *G03B 21/62* (2013.01); *G09B 5/02* (2013.01); *H05K 7/20136* (2013.01)

(58) Field of Classification Search
CPC ........ G03B 21/10; G03B 21/16; G03B 21/28; G03B 21/62; G03B 21/145; G03B 21/606; G09B 5/02; G09B 5/04; G09B 5/06; G09B 5/062; G09B 5/065; G09B 5/067; H05K 7/20; H05K 7/20136; H05K 7/20154; H05K 7/20172
See application file for complete search history.

(56) References Cited

U.S. PATENT DOCUMENTS

| 7,988,452 B2 * | 8/2011 | Eiwen .................. G01M 3/027 434/270 |
|---|---|---|
| 8,256,904 B2 | 9/2012 | Reichow et al. |
| 8,517,543 B2 | 8/2013 | Reichow et al. |

(Continued)

FOREIGN PATENT DOCUMENTS

| CN | 101354523 | 1/2009 |
|---|---|---|
| CN | 107229177 | 10/2017 |

(Continued)

*Primary Examiner* — Sultan Chowdhury
(74) *Attorney, Agent, or Firm* — JCIPRNET

(57) ABSTRACT

A projection apparatus including a housing and a first projection module is provided. The housing includes a curved projection area and an opening, wherein the curved projection area includes an inner surface and an outer surface opposite to each other. The first projection module is detachably disposed in the housing through the opening and corresponds to the curved projection area, wherein the first projection module projects an image onto the inner surface of the curved projection area, such that the outer surface of the curved projection area displays the projected image. The projection apparatus provided by the invention has the curved projection area to dynamically display a stereo image.

15 Claims, 9 Drawing Sheets

(56) References Cited

U.S. PATENT DOCUMENTS

| | | | |
|---|---|---|---|
| 9,810,975 B2 | 11/2017 | Mahoor et al. | |
| 11,061,304 B2 * | 7/2021 | Barnett | H04N 9/3194 |
| 2008/0049189 A1 * | 2/2008 | Vrachan | G02B 30/56 |
| | | | 353/10 |
| 2016/0231645 A1 * | 8/2016 | Mahoor | G03B 21/62 |

FOREIGN PATENT DOCUMENTS

| | | |
|---|---|---|
| TW | I440955 | 6/2014 |
| TW | 201640213 | 11/2016 |
| TW | M574376 | 2/2019 |
| WO | 2017033565 | 3/2017 |

* cited by examiner

PROJECTION APPARATUS

CROSS-REFERENCE TO RELATED APPLICATION

This application claims the priority benefit of China application serial no. 202010122427.4, filed on Feb. 27, 2020. The entirety of the above-mentioned patent application is hereby incorporated by reference herein and made a part of this specification.

BACKGROUND OF THE INVENTION

1. Field of the Invention

The invention relates to a projection apparatus, and in particular, to a projection apparatus having a curved projection area.

2. Description of Related Art

At present, because a human body model is usually a fixed mannequin or dummy, if information such as a human organ is to be introduced to students, such information cannot be dynamically displayed and cannot be arbitrarily replaced. For an apparatus capable of implementing dynamic display, at present, only a robot with a flat display as a head or an abdomen is available, but such robot can only present a planar image which is different from an actual situation.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

Other objectives, features and advantages of the invention will be further understood from the further technological features disclosed by the embodiments of the present invention wherein there are shown and described preferred embodiments of this invention, simply by way of illustration of modes best suited to carry out the invention.

The invention provides a projection apparatus, including a curved projection area, so that a stereo image may be dynamically displayed.

Other objectives and advantages of the invention may be further known from technical features disclosed in the invention.

In order to achieve one of or a part of or all of the foregoing objectives or other objectives, a projection apparatus according to an embodiment of the invention includes a housing and a first projection module. The housing includes a curved projection area and an opening, the curved projection area including an inner surface and an outer surface opposite to each other. The first projection module is detachably disposed in the housing through the opening and corresponds to the curved projection area, the first projection module performing projection toward the inner surface of the curved projection area, such that the outer surface of the curved projection area displays a projected image.

Based on the foregoing, the housing of the projection apparatus according to an embodiment of the invention includes the curved projection area. The first projection module may project an image on the inner surface of the curved projection area, so that the outer surface of the curved projection area displays the projected image and may display a dynamic or static stereo image, to provide a good display effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
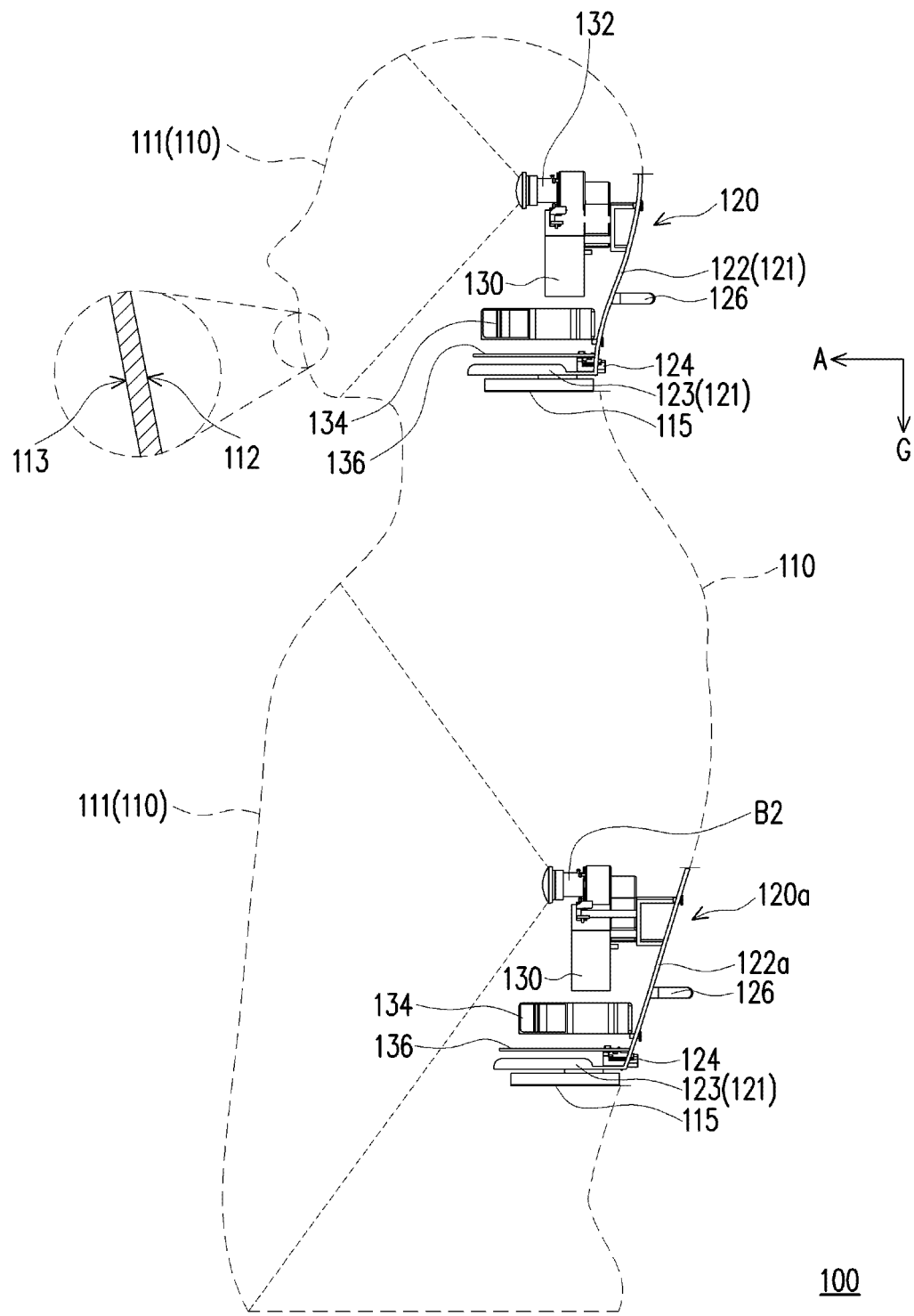
FIG. 1 is a schematic diagram of a projection apparatus according to an embodiment of the invention.
Figure 2:
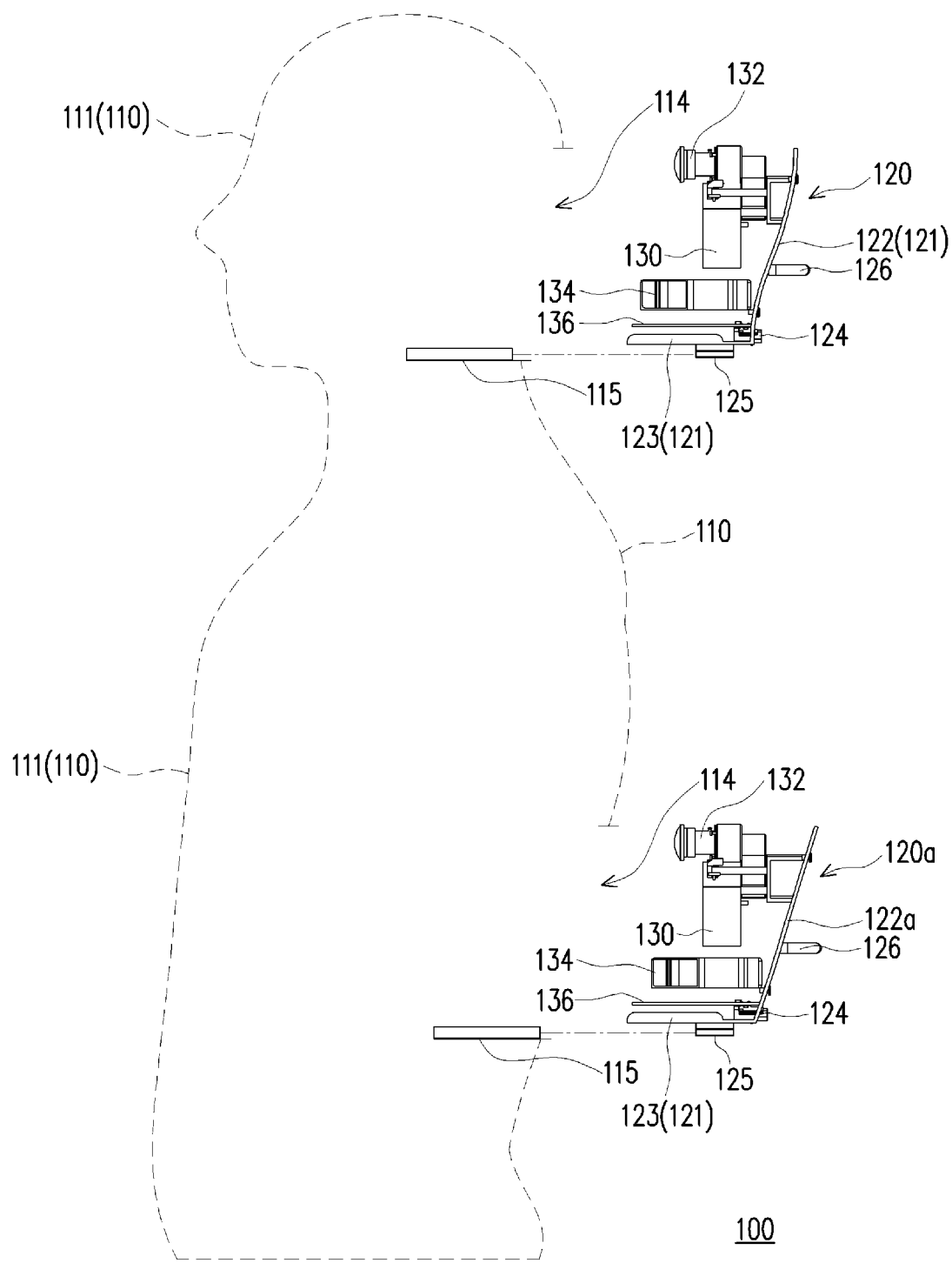
FIG. 2 is a schematic diagram of a first projection module and a second projection module that are pulled out of a housing and that are of the projection apparatus of FIG. 1.

FIG. 1 is a schematic diagram of a projection apparatus according to an embodiment of the invention. FIG. 2 is a schematic diagram of a first projection module and a second projection module that are pulled out of a housing and that are of the projection apparatus of FIG. 1. Referring to FIG. 1 and FIG. 2, a projection apparatus 100 of the embodiment includes a housing 110 and a first projection module 120. In FIG. 1 and FIG. 2, in order to clearly show an element inside the housing 110, the housing 110 is shown by a dotted line. In the embodiment, a shape of the housing 110 is a human body contour, including a head part and a body part. In other embodiments, the shape of the housing 110 may also be only a head contour or a body contour, or the shape of the housing 110 may also be an animal contour, but the shape of the housing 110 is not limited thereto.

As shown in FIG. 2, the housing 110 includes a curved projection area 111 and an opening 114. The first projection module 120 is detachably disposed in the housing 110 through the opening 114 to facilitate replacement or maintenance of the first projection module 120. When the first projection module 120 is assembled in the housing 110, the first projection module 120 may correspond to the curved projection area 111 of the housing 110. A part of the housing 110, which corresponds to the curved projection area 111, is a projection film of which light transmissivity is greater than 50%. The other part of the housing 110, which corresponds to an area other than the curved projection area 111, is lightproof.

The curved projection area 111 of the housing 110 includes an inner surface 112 and an outer surface 113 opposite to each other. The first projection module 120 located inside the housing 110 performs projection toward the inner surface 112 of the curved projection area 111, so that the outer surface 113 of the curved projection area 111 displays a projected image, that is, a viewer may watch the projected image from the outer surface 113 of the curved projection area 111. In the embodiment, if the curved projection area 111 is located at the head part or body part of the housing 110, the projection apparatus 100 may display various facial expressions or an image of a real organ on the outer surface 113 of the curved projection area 111 to vividly and realistically represent a real condition, so that dynamic, static, and pathological analysis of the organ in various states is displayed for teaching and introduction. In other embodiments, the curved projection area 111 corresponding to the head part of the housing 110 is a replaceable projection film, such as a projection film having a male facial contour or a female facial contour. The replaceable projection film is, for example, provided with a magnet on an inner surface thereof so as to be attracted with a corresponding magnet or metal member disposed on the housing for fixing to the housing. In addition, the replaceable projection film, for example, may also be fixed to the housing through a hook (buckle) structure in a locking or hanging manner, but the fixing manner is not limited thereto.

Figure 9:
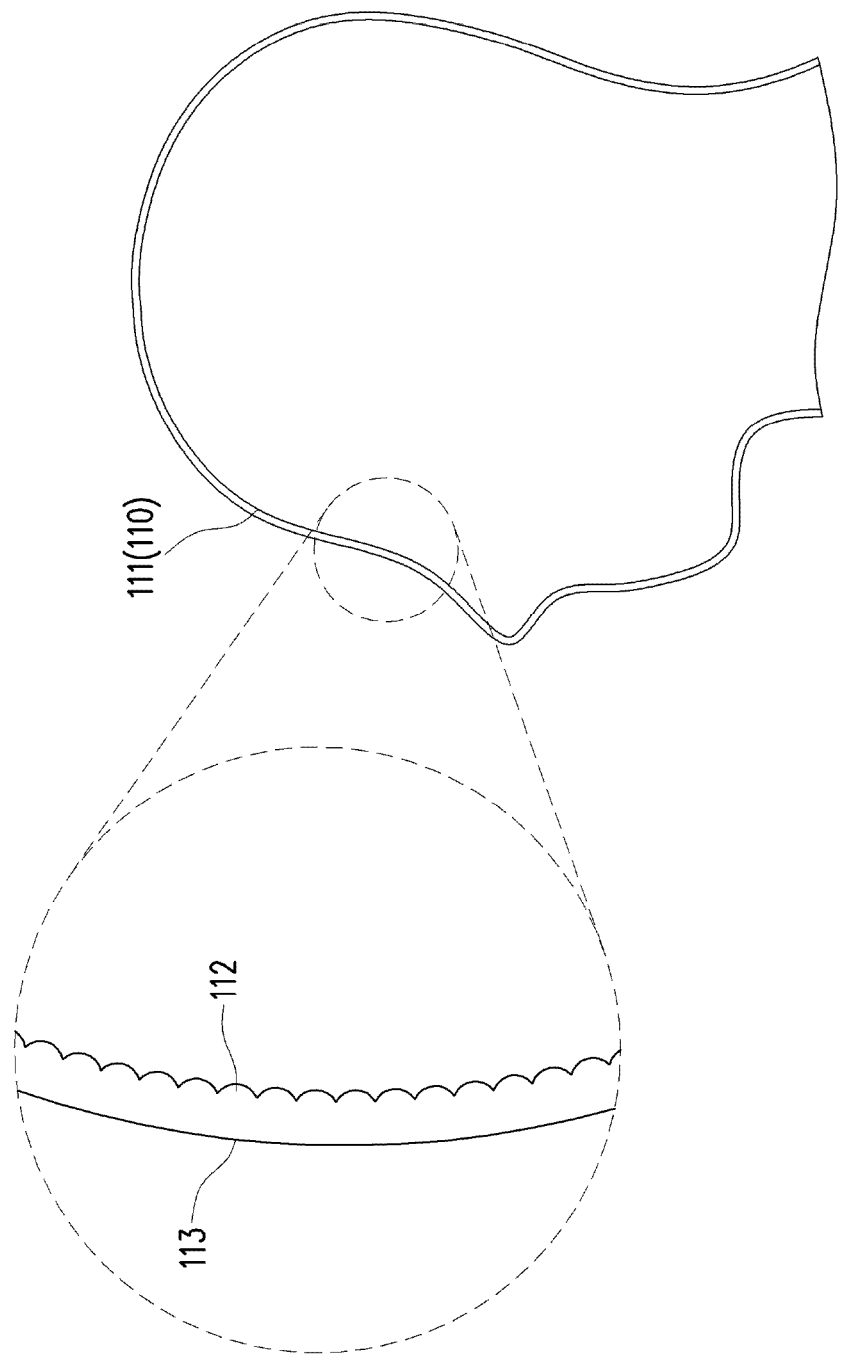
FIG. 9 is a schematic diagram of a curved projection area of a housing of FIG. 1.

In the embodiment, roughness of the inner surface 112 of the curved projection area 111 of the housing 110 is greater than roughness of the outer surface 113. For example, the inner surface 112 of the curved projection area 111, for example, may be provided with a microstructure (such as a texture or a rough transparent coating), and such a design may cause the projected image to be clearer and distincter. In an embodiment shown in FIG. 9, the curved projection area 111 of the housing 110 has a smooth outer surface 113, and the inner surface 112 has a microstructure or a granular structure. In other embodiments, corresponding to a material used for the curved projection area of the housing, the curved projection area may also have a smooth inner surface, and the outer surface may have a microstructure or a granular structure, and the invention is not limited thereto.

In addition, in the embodiment, the first projection module 120 includes a first sliding portion 125 (FIG. 2), and the housing 110 further includes a first sliding rail portion 115 located and fixed inside, and The first sliding trail portion 115 corresponds to the first sliding portion 125 of the first projection module 120. The first sliding portion 125 of the first projection module 120 is detachably and slidably disposed on the first sliding rail portion 115 of the housing 110 along an axis A. The first sliding portion 125 may be a roller or a slider. The first sliding rail portion 115 may be a sliding rail corresponding to the roller or slider, and is configured to bear weight of the first projection module 120 and allow the first projection module to slide thereon, so as to improve movement stability of the first projection module 120. More preferably, a block (not shown) may be disposed on the first sliding rail portion 115 to limit a position of the first sliding portion 125 and assist in positioning of the first projection module 120.

In addition, after the first projection module 120 is pushed into the housing 110, the first projection module 120 may be fixed inside the housing 110 through a screw or the like, which is quite convenient for disassembly and assembly. In the embodiment, the axis A is, for example, perpendicular to a direction of gravity G, but a relationship between the axis A and the direction of gravity G is not limited thereto.

Figure 3:
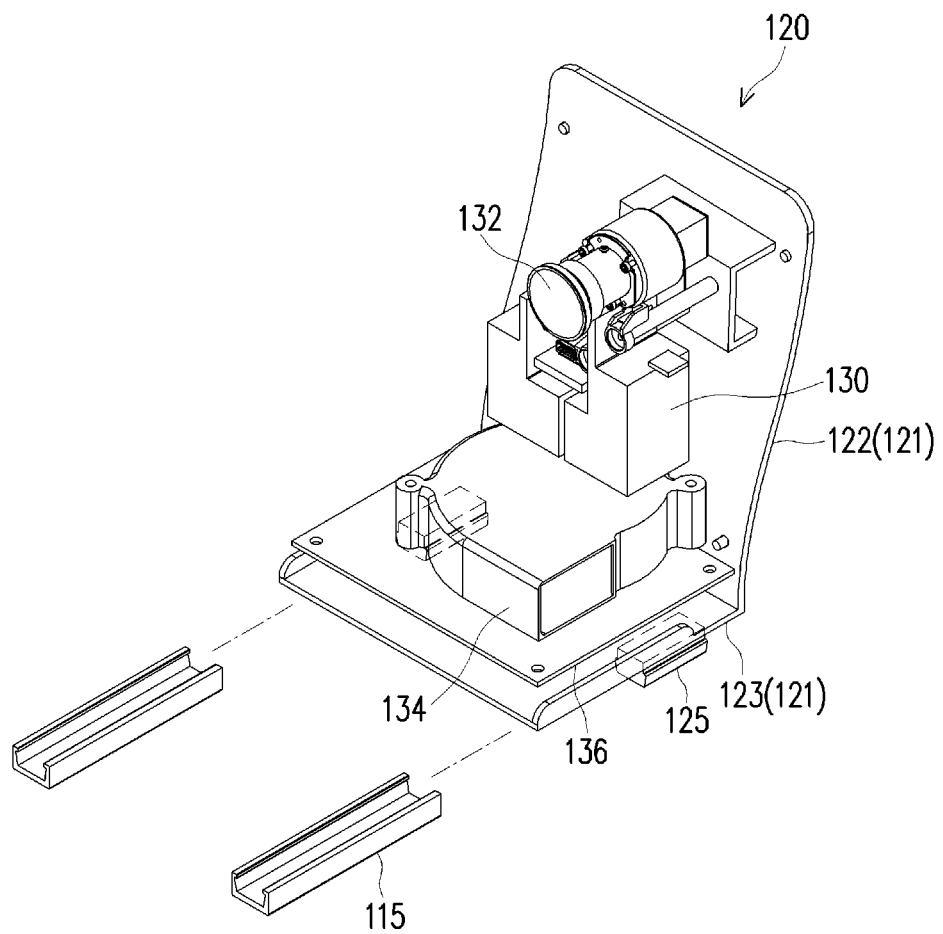
FIG. 3 is a schematic diagram of the first projection module of the projection apparatus of FIG. 1.
Figure 4:
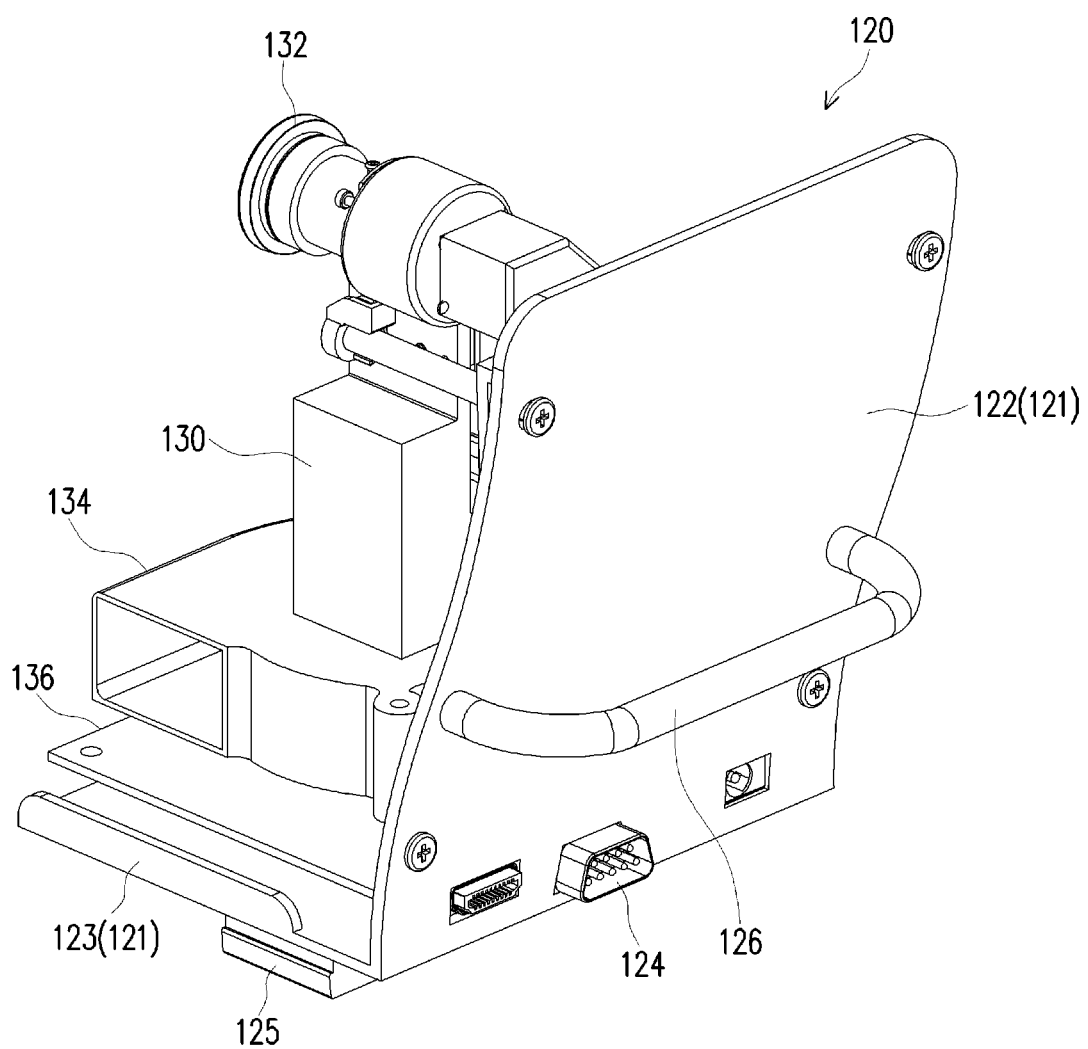
FIG. 4 is a schematic diagram of FIG. 3 from another perspective.

FIG. 3 is a schematic diagram of the first projection module of the projection apparatus of FIG. 1. FIG. 4 is a schematic diagram of FIG. 3 from another perspective. Referring to FIG. 3 and FIG. 4, in the embodiment, the first projection module 120 includes a supporting base 121, an optical machine 130 disposed on the supporting base 121, a projection lens 132, a fan 134, and a circuit board 136. The optical machine 130 and the fan 134 are electrically connected to the circuit board 136.

It may be seen from FIG. 1 to FIG. 4 that the supporting base 121 has a curved contour. The curved contour conforms to a contour of the housing 110 around the corresponding opening 114. When the first projection module 120 is assembled in the housing 110, the supporting base 121 may completely cover the opening 114 of the housing 110. For example, the curved contour conforms to a contour of a back of the head part or a back of the body part, but the invention is not limited thereto. The projection lens 132 faces the inner surface 112 of the curved projection area 111 of the housing 110 to project an image on the inner surface 112 of the curved projection area 111.

The fan 134 is configured to dissipate heat of the optical machine 130. In addition, when the first projection module 120 is mounted in the housing 110, and the supporting base 121 covers the opening 114 of the housing 110, heat generated by the first projection module 120 flows in the housing 110 through an operation of the fan 134, and warm airflow is transmitted to other positions inside the housing 110, so that the housing 110 is in a slightly warm state, and a warm sense may be presented when the housing 110 is touched by a user.

As shown in FIG. 1 and FIG. 3, the supporting base 121 includes a first plate 122, and the optical machine 130, the projection lens 132, the fan 134, and the circuit board 136 are, for example, disposed on the first plate 122 along the direction of gravity G (FIG. 1). In the embodiment, because the housing 110 is narrow and long, in order to effectively use a system volume, the optical machine 130, the projection lens 132, the fan 134, and the circuit board 136 are stacked in a height direction (the direction of gravity G), but a direction in which the optical machine 130, the projection lens 132, the fan 134, and the circuit board 136 are stacked is not limited thereto. The first plate 122 of the supporting base 121 may completely cover the opening 114 of the housing 110 and may be fixed to the housing 110 through at least one locking point.

In addition, as shown in FIG. 4, the supporting base 121 includes a grip 126 disposed on the first plate 122 and exposed on an outside of the first plate 122 of the supporting base 121, so that a user or a maintenance personnel may easily replace and pull out the first projection module 120 through the grip 126 of the supporting base 121. In addition, the supporting base 121 further includes a second plate 123 extending from the first plate 122 in a bent manner, that is, the first plate 122 and the second plate 123 form an L-shaped supporting base 121 (for example, the first plate 122 conforms to a contour of the housing around a corresponding opening), and the first sliding portion 125 is disposed on the second plate 123. However, in an embodiment, the second plate 123 may also be omitted.

As shown in FIG. 1, FIG. 2, and FIG. 4, the supporting base 121 includes at least one connector slot 124, and the circuit board 136 is disposed on an inner side of the supporting base 121. At least one connector slot 124 is coupled to the circuit board 136 and is exposed outside the supporting base 121. When the first projection module 120 is assembled in the housing 110, the connector slot 124 may connect with other signal sources (such as USB, HDMI) or power from the outside of the housing 110, to facilitate update of projection contents or charging.

In the embodiment, the projection apparatus 100 further includes a second projection module 120a and a curved projection area 111 located at a position of the body part. The second projection module 120a projects an image on the inner surface 112 of the curved projection area 111 located at the body part, and information such as an internal organ is displayed on the outer surface 113 of the curved projection area 111 located at the body part. A second projection module 120a is basically the same as the first projection module 120, and the descriptions thereof are omitted herein. In particular, the first projection module 120 and the second projection module 120a are disposed at positions corresponding to the head part and the body part in the housing 110, respectively. The first projection module 120 located inside the head part of the housing 110 performs a projection on the curved projection area 111 located at the head part of the housing 110. The second projection module 120a located inside the body part of the housing 110 performs a projection on the curved projection area 111 located at the body part of the housing 110. A contour of the first plate 122a of the second projection module 120a corresponds to a contour of a back of the body part, and is slightly different from the contour of the first plate 122 of the first projection module 120.

Figure 5:
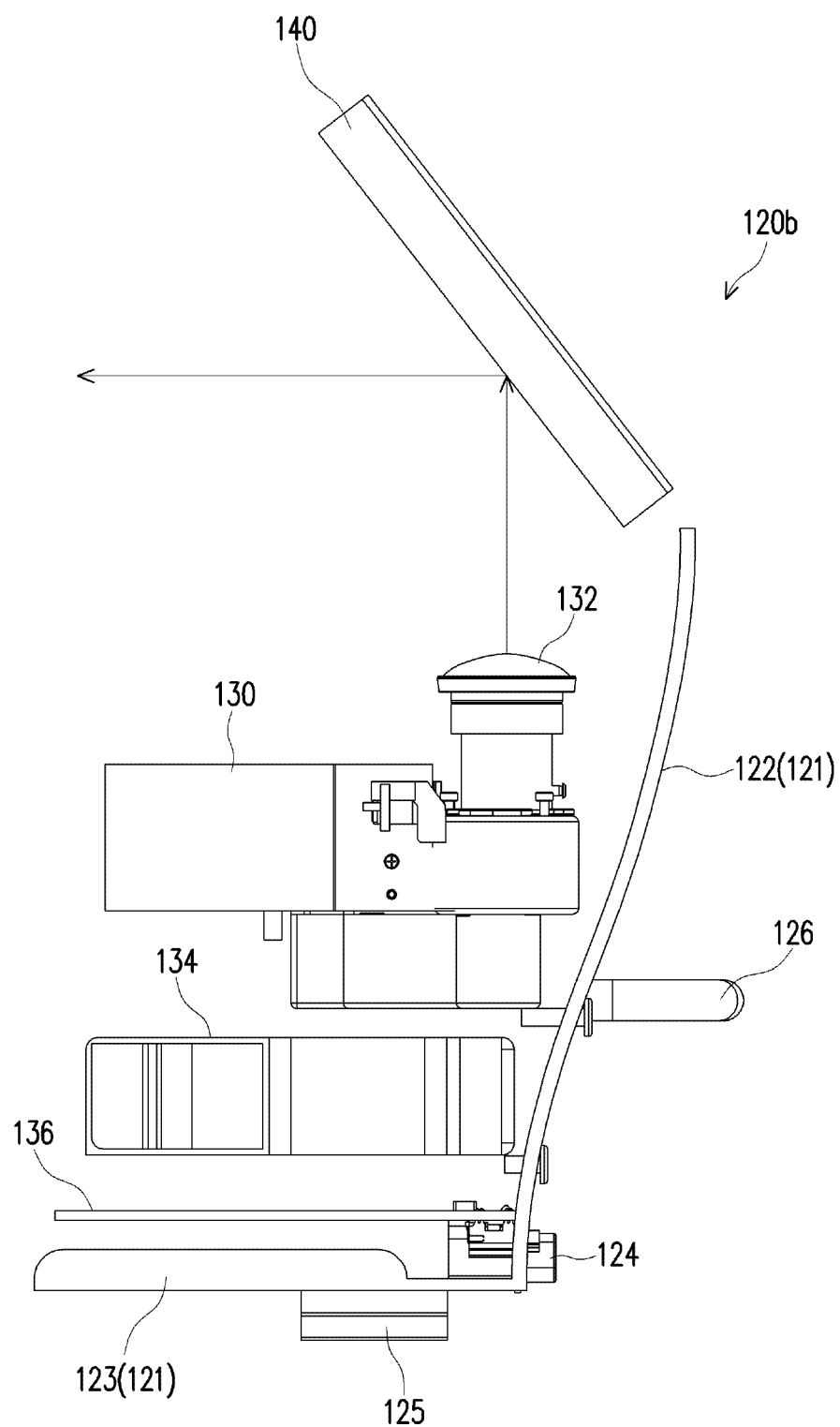
FIG. 5 is a schematic diagram of a first projection module according to another embodiment of the invention.

FIG. 5 is a schematic diagram of a first projection module according to another embodiment of the invention. Referring to FIG. 5, in the embodiment, a first projection module 120b further includes a reflecting mirror 140. A projection lens 132 is, for example, a short-focus lens. The projection lens 132 faces the reflecting mirror 140. The reflecting mirror 140 reflects an image projected from the projection lens 132 to an inner surface 112 of a curved projection area 111, to achieve a desired projection effect under a limited projection distance.

Figure 6:
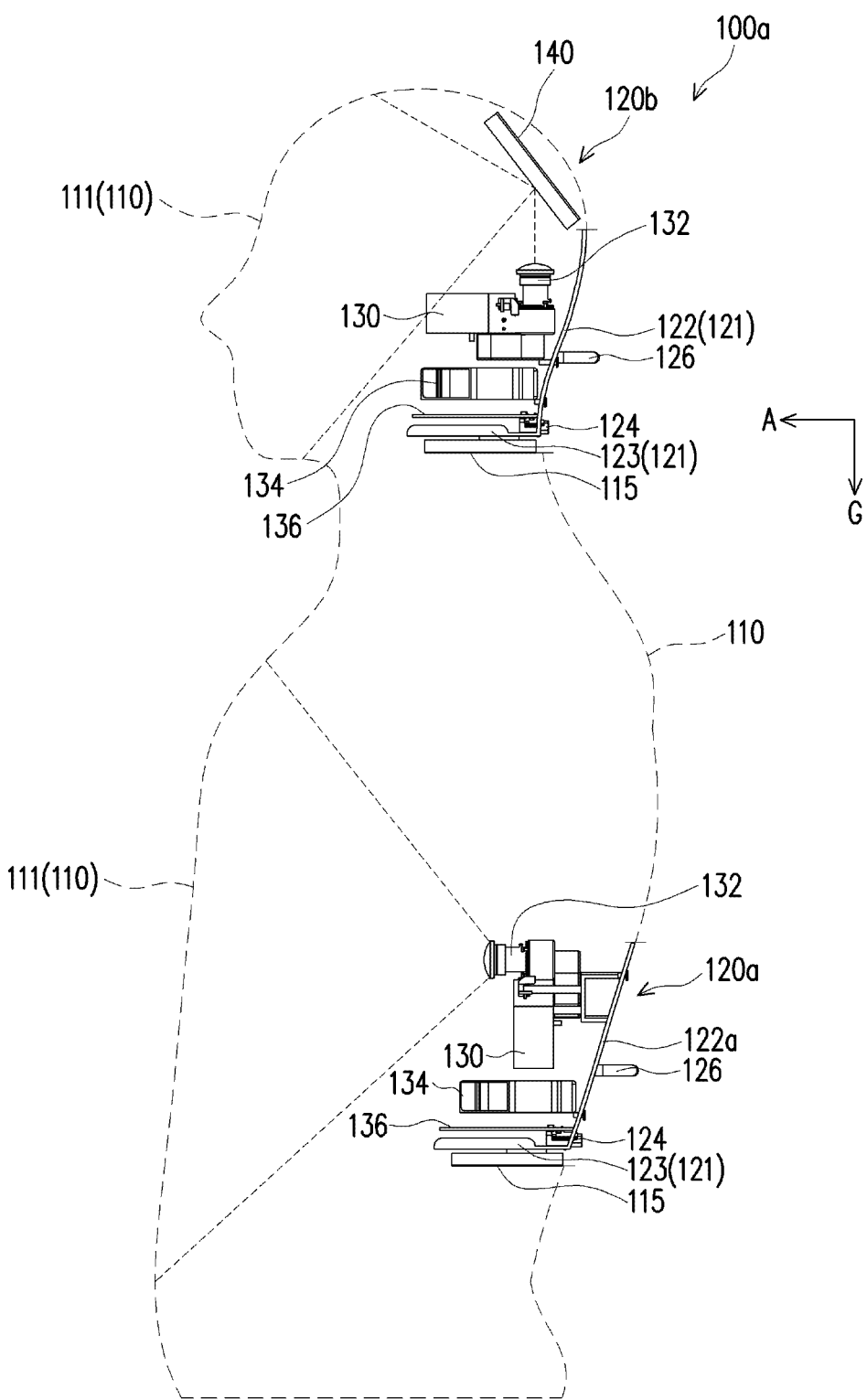
FIG. 6 is a schematic diagram of a projection apparatus according to another embodiment of the invention.

FIG. 6 is a schematic diagram of a projection apparatus according to another embodiment of the invention. Referring to FIG. 6, in a projection apparatus 100a of FIG. 6, because a distance from the front to the rear of the head part of the housing 110 is small, a first projection module 120b including a reflecting mirror 140 may be mounted to lengthen a projection path. For a second projection module 120a corresponding to a position of the body part, a type thereof without the reflecting mirror 140 may be selected. Definitely, in an embodiment, the first projection module 120b having the reflecting mirror 140 may also be selected on both the head part and the body part.

Figure 7:
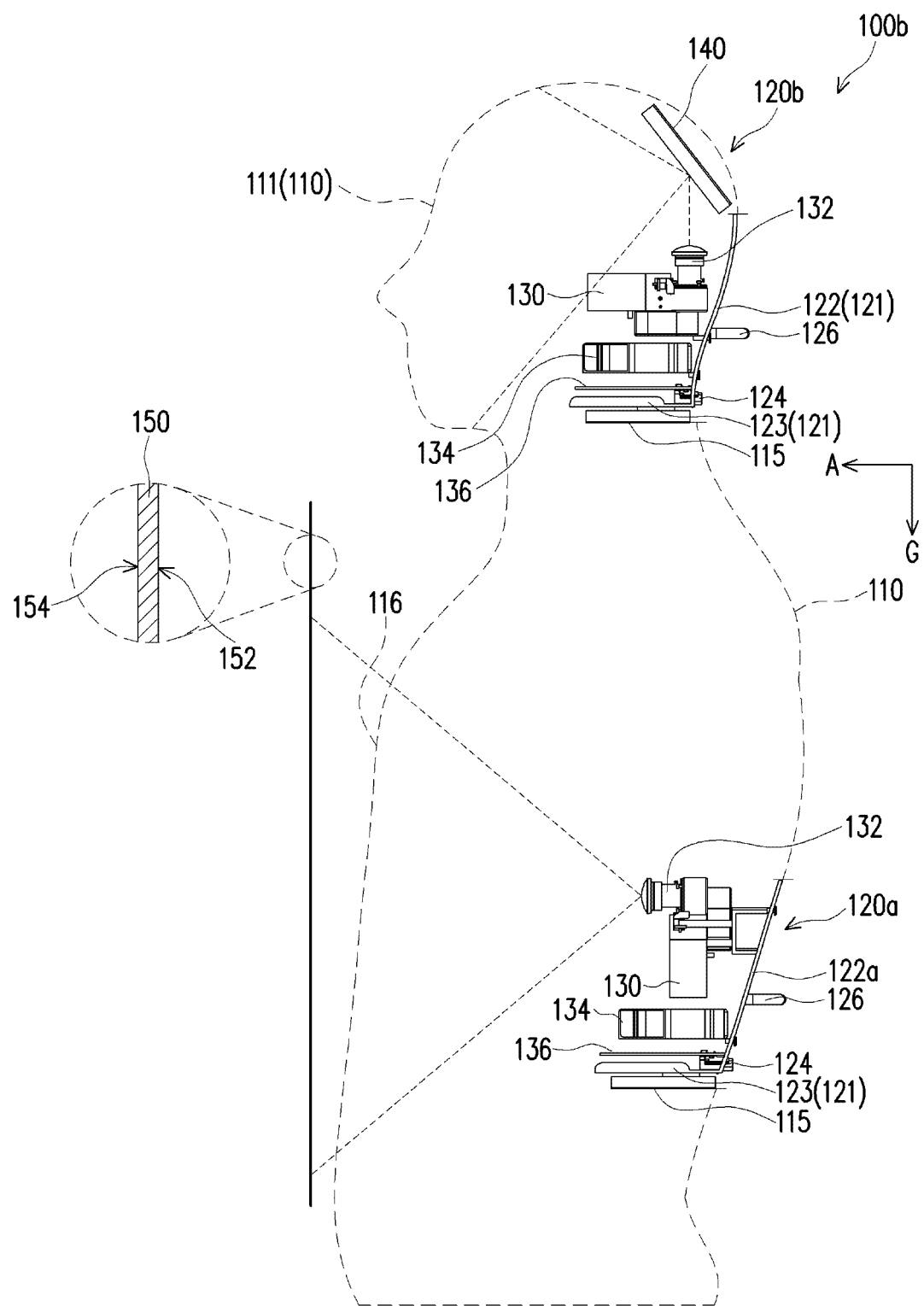
FIG. 7 is a schematic diagram of a projection apparatus according to another embodiment of the invention.

FIG. 7 is a schematic diagram of a projection apparatus according to another embodiment of the invention. Referring to FIG. 7, a projection apparatus 100b further includes a projection screen 150 disposed outside a housing 110. The housing 110 includes a light transmitting area 116 located on a light transmission path of an image projected from a projection lens 132 of a second projection module 120a. The light transmitting area 116 may be transparent glass or transparent plastic, or the light transmitting area 116 may be a hollowed opening, a position of the projection screen 150 corresponding to the light transmitting area 116 of the housing 110. When the second projection module 120a is mounted in the body part of the housing 110, the second projection module 120a performs projection on the projection screen 150. An image projected from the second projection module 120a passes through the light-transmitting area 116 of the housing 110 and is projected onto a first surface 152 of the projection screen 150, so that a second surface 154 of the projection screen 150 displays a projected image. The first surface 152 of the projection screen 150 faces the light transmitting area 116 of the housing 110, that is, a viewer may watch the projected image from the second surface 154 of the projection screen 150.

Figure 8:
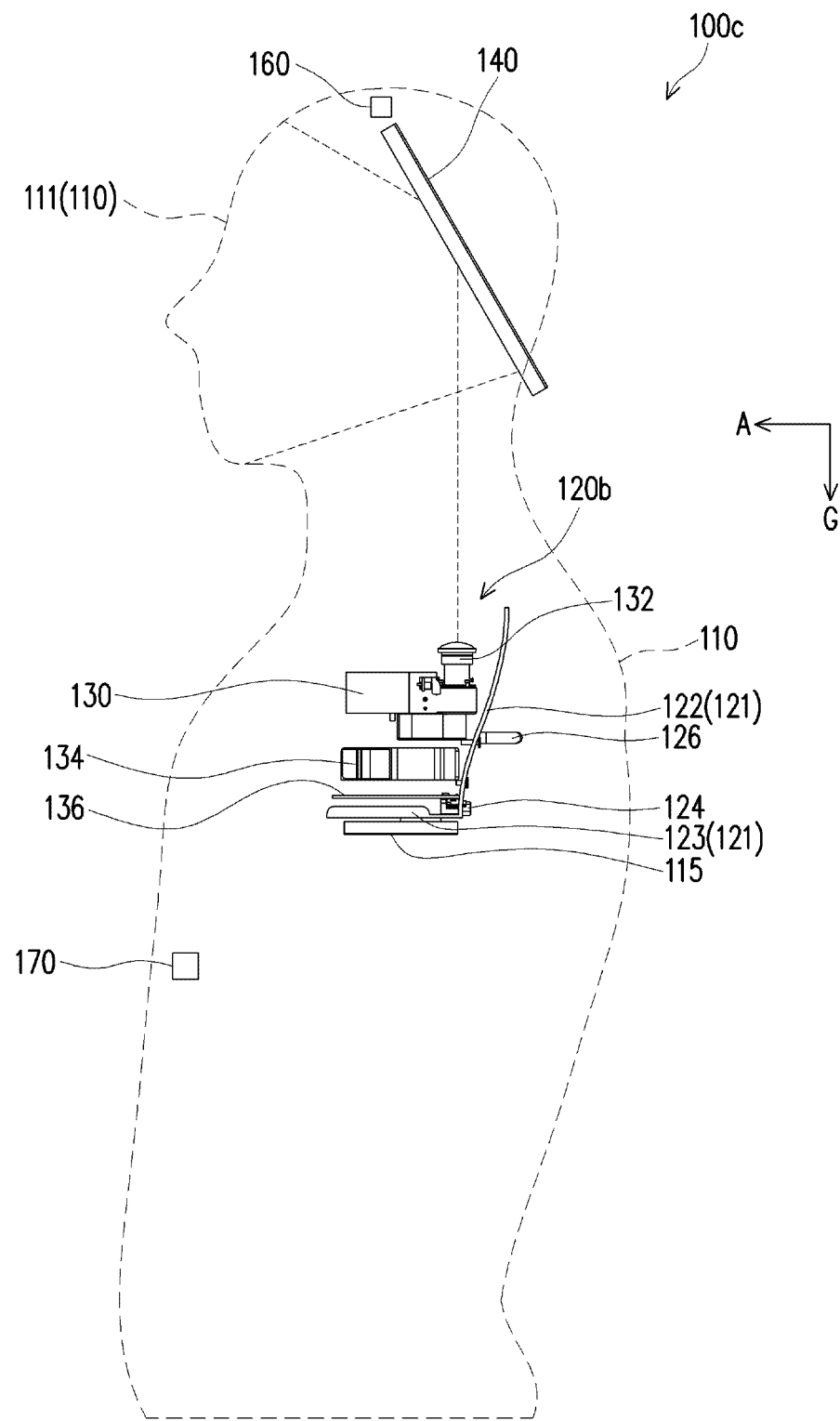
FIG. 8 is a schematic diagram of a projection apparatus according to another embodiment of the invention.

FIG. 8 is a schematic diagram of a projection apparatus according to another embodiment of the invention. Referring to FIG. 8, in a projection apparatus 100c of FIG. 8, a first projection module 120b (as shown in FIG. 5) having a reflecting mirror 140 may be mounted. A difference from the embodiment of FIG. 6 is that the first projection module 120b is disposed in a housing 110, the reflecting mirror 140 is located at a position of the head part, and an optical machine 130, a projection lens 132, a fan 134, and a circuit board 136 are disposed at positions of the body part in a direction of gravity G. The projection lens 132 is, for example, a telephoto lens, the projection lens 132 faces the reflecting mirror 140, and the reflecting mirror 140 reflects the image projected from the projection lens 132 to a curved projection area 111 located at the head part of the housing 110. In addition, the projection apparatus 100c of the embodiment may include a camera 160 and a speaker 170. For example, the camera 160 is disposed on the head part of the housing 110, and the speaker 170 is disposed on the body part of the housing 110, so that the apparatus has a function of image and voice recording.

Based on the foregoing, the housing of the projection apparatus according to an embodiment of the invention includes the curved projection area. The first projection module may project an image on the inner surface of the curved projection area, so that the outer surface of the curved projection area displays the projected image and may display a dynamic or static stereo image, to provide a good display effect.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projection apparatus, comprising a housing and a first projection module, wherein
   the housing comprises a curved projection area and an opening, wherein the curved projection area comprises an inner surface and an outer surface opposite to each other; and
   the first projection module is detachably disposed in the housing through the opening and corresponds to the curved projection area, wherein the first projection module projects an image onto the inner surface of the curved projection area, such that the outer surface of the curved projection area displays a projected image,
   wherein the first projection module comprises a first sliding portion, the housing further comprises a first sliding rail portion located inside and corresponding to the first sliding portion, the first sliding portion of the first projection module is detachably and slidably disposed on the first sliding rail portion along an axis, and the axis is perpendicular to a direction of gravity.

2. The projection apparatus according to claim 1, wherein a shape of the housing is a human body contour, a head contour, or an animal contour.

3. The projection apparatus according to claim 1, wherein light transmissivity of the curved projection area of the housing is greater than 50%.

4. The projection apparatus according to claim 1, wherein roughness of the inner surface of the curved projection area is greater than roughness of the outer surface.

5. A projection apparatus, comprising a housing and a first projection module, wherein
   the housing comprises a curved projection area and an opening, wherein the curved projection area comprises an inner surface and an outer surface opposite to each other; and
   the first projection module is detachably disposed in the housing through the opening and corresponds to the curved projection area, wherein the first projection module projects an image onto the inner surface of the curved projection area, such that the outer surface of the curved projection area displays a projected image,
   wherein the first projection module comprises a supporting base, an optical machine disposed on the supporting base, a projection lens, a fan, and a circuit board, the optical machine and the fan are electrically connected to the circuit board, the supporting base has a curved contour, and the curved contour conforms to a contour of the housing around a corresponding opening.

6. The projection apparatus according to claim 5, wherein the supporting base comprises a first plate, the optical machine, the projection lens, the fan, and the circuit board are disposed on the first plate along an axis, and the axis is the same as or different from a direction of gravity.

7. The projection apparatus according to claim 6, wherein the supporting base further comprises a second plate extending from the first plate in a bent manner and the first projection module comprises a first sliding portion disposed on the second plate.

8. The projection apparatus according to claim 6, wherein the supporting base comprises a grip disposed on the first plate and exposed outside the first plate of the supporting base.

9. The projection apparatus according to claim 5, wherein the projection lens faces the inner surface of the curved projection area.

10. The projection apparatus according to claim 5, wherein the first projection module projects the image onto the inner surface of the curved projection area, the first projection module further comprises a reflecting mirror, the projection lens faces the reflecting mirror, and the reflecting mirror reflects the image projected from the projection lens to the inner surface of the curved projection area.

11. The projection apparatus according to claim 5, wherein the supporting base comprises at least one connector slot, the circuit board is disposed on an inner side of the supporting base, and the at least one connector slot is coupled to the circuit board and is exposed outside an outer side of the supporting base.

12. The projection apparatus according to claim 5, wherein when the first projection module is mounted in the housing, the supporting base covers the opening of the housing, and a heat generated by the first projection module flows in the housing through the fan.

13. A projection apparatus, comprising a housing and a first projection module, wherein the housing comprises a curved projection area and an opening, wherein the curved projection area comprises an inner surface and an outer surface opposite to each other; and the first projection module is detachably disposed in the housing through the opening and corresponds to the curved projection area, wherein the first projection module projects an image onto the inner surface of the curved projection area, such that the outer surface of the curved projection area displays a projected image, the projection apparatus further comprising a second projection module, the housing comprising an opening corresponding to the second projection module, the second projection module being detachably disposed in the housing through the opening, and the second projection module comprising a supporting base, an optical machine, a projection lens, a fan, and a circuit board, wherein the optical machine, the projection lens, the fan, and the circuit board are disposed on the supporting base.

14. The projection apparatus according to claim 13, wherein the housing comprises a curved projection area corresponding to the second projection module, the curved projection area corresponding to the second projection module comprises an inner surface and an outer surface opposite to each other, and the second projection module projects an image onto the inner surface of the curved projection area corresponding to the second projection module.

15. The projection apparatus according to claim 13, further comprising a projection screen disposed outside the housing, wherein the housing comprises a light transmitting area located on an optical path of the image projected from the projection lens of the second projection module, and when the second projection module is mounted in the housing, the second projection module projects the image onto the projection screen and the image projected from the second projection module passes through the light transmitting area to be projected onto a first surface of the projection screen, such that a second surface of the projection screen displays the projected image.

* * * * *